United States Patent
Lu et al.

(10) Patent No.: US 9,889,477 B2
(45) Date of Patent: Feb. 13, 2018

(54) METHOD AND APPARATUS FOR ENHANCED CLEANING AND INSPECTION

(71) Applicant: Taiwan Semiconductor Manufacturing Company, Ltd., Hsin-Chu (TW)

(72) Inventors: Chi-Lun Lu, Hsinchu (TW); Sheng-Chi Chin, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 189 days.

(21) Appl. No.: 14/857,650

(22) Filed: Sep. 17, 2015

(65) Prior Publication Data

US 2016/0005591 A1 Jan. 7, 2016

Related U.S. Application Data

(62) Division of application No. 13/542,361, filed on Jul. 5, 2012, now Pat. No. 9,138,785.

(51) Int. Cl.
| | |
|---|---|
| *B08B 5/00* | (2006.01) |
| *B08B 6/00* | (2006.01) |
| *B08B 7/02* | (2006.01) |
| *H01L 21/12* | (2006.01) |
| *G03F 1/82* | (2012.01) |
| *B05C 13/00* | (2006.01) |
| *B05C 11/02* | (2006.01) |
| *A47L 13/40* | (2006.01) |
| *B05C 13/02* | (2006.01) |

(Continued)

(52) U.S. Cl.
CPC ............... *B08B 5/00* (2013.01); *A47L 13/40* (2013.01); *B05C 11/02* (2013.01); *B05C 13/02* (2013.01); *B08B 5/02* (2013.01); *B08B 6/00* (2013.01); *B08B 7/0057* (2013.01); *B08B 7/02* (2013.01); *B08B 7/028* (2013.01); *G03F 1/82* (2013.01); *H01L 21/0206* (2013.01); *H01L 21/67028* (2013.01); *H01L 21/67359* (2013.01); *H01L 22/12* (2013.01)

(58) Field of Classification Search
CPC .... B08B 5/00; B08B 5/02; B08B 6/00; B08B 7/0057; B08B 7/02; B08B 7/028; H01L 21/0206; H01L 21/67028; H01L 21/67359; H01L 22/12; B05C 11/02; B05C 13/02; A47L 13/40; G03F 1/82
See application file for complete search history.

(56) References Cited

U.S. PATENT DOCUMENTS

| | | | |
|---|---|---|---|
| 5,584,938 A | 12/1996 | Douglas | |
| 6,205,676 B1 * | 3/2001 | Fujii | B08B 6/00 134/1.3 |

(Continued)

*Primary Examiner* — Saeed T Chaudhry
(74) *Attorney, Agent, or Firm* — Haynes and Boone, LLP (57) ABSTRACT

A cleaning and inspection system includes a cleaning chamber and retaining structure disposed within the cleaning chamber and configured to secure an article to be cleaned within the cleaning chamber. The cleaning and inspection system also includes a gas distributor disposed within the cleaning chamber and configured to distribute a turbulent flow of gas into the cleaning chamber that facilitates removal of foreign particles from a surface of the article. Further, the system includes a particle collection surface positioned to collect foreign particles removed from the surface of the article.

20 Claims, 6 Drawing Sheets

(51) Int. Cl.
- *B08B 5/02* (2006.01)
- *B08B 7/00* (2006.01)
- *H01L 21/67* (2006.01)
- *H01L 21/673* (2006.01)
- *H01L 21/02* (2006.01)
- *H01L 21/66* (2006.01)

(56) References Cited

U.S. PATENT DOCUMENTS

| | | | |
|---|---|---|---|
| 6,449,035 B1 * | 9/2002 | Batchelder | G01N 1/02 356/237.1 |
| 7,913,702 B2 | 3/2011 | Moriya | |

* cited by examiner

METHOD AND APPARATUS FOR ENHANCED CLEANING AND INSPECTION

PRIORITY DATA

This application is a divisional of U.S. patent application Ser. No. 13/542,361, filed on Jul. 5, 2012, entitled "Method and Apparatus for Enhanced Cleaning and Inspection," the entirety of which is hereby incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, in semiconductor technologies, a plurality of photomasks (masks) are formed with predesigned IC patterns. The plurality of masks are used during lithography processes to transfer the predesigned IC patterns to multiple semiconductor wafers. As such, photomask must be substantially devoid of foreign particles during the lithography process. Commonly, photomasks are transported between stations in a semiconductor fabrication facility inside of a transportation/storage pod. Some types of photomasks are protected by pellicles during transportation, however, other types of photomasks—such as masks used for EUV (extreme ultraviolet) lithography—may not be protectable by pellicles. Further, EUV photomasks may be more sensitive to contamination because of smaller feature size. Thus, in some cases, foreign particles attached to the inside of a pod may transfer a photomask during transportation. Accordingly, it may be desirable to thoroughly clean a photomask pod before it is used to transport a photomask. However, it may be difficult to determine if a pod is substantially free of foreign particles after a cleaning. Thus, although existing systems and approaches have been satisfactory for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
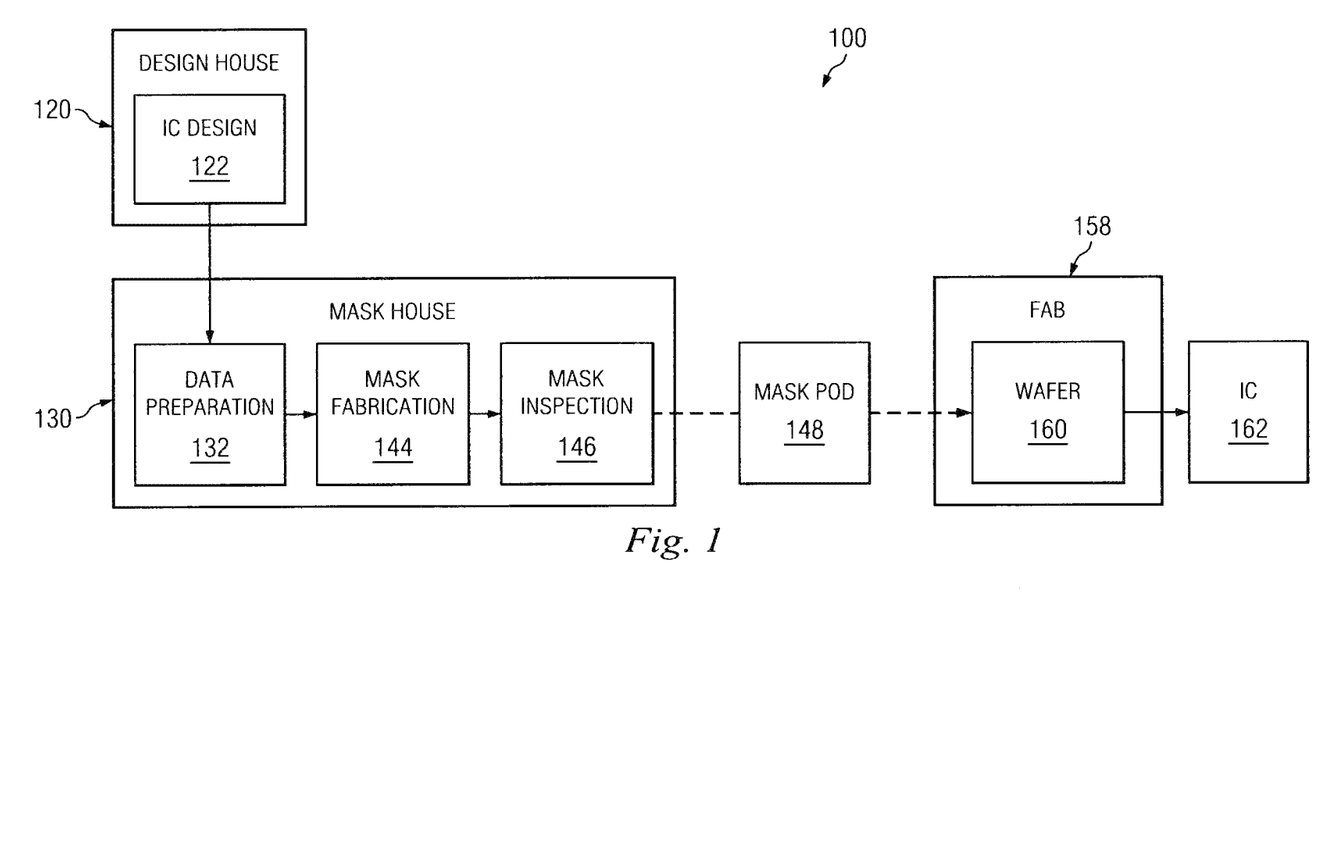
FIG. 1 is a simplified block diagram of an embodiment of an integrated circuit (IC) manufacturing system and an associated IC manufacturing flow.

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 158 (i.e., a fab), that interact with one another in the design, development, and manufacturing cycles and/or services related to manufacturing an integrated circuit (IC) device 162. The plurality of entities are connected by a communications network, which may be a single network or a variety of different networks, such as an intranet and the Internet, and may include wired and/or wireless communication channels. Each entity may interact with other entities and may provide services to and/or receive services from the other entities. The design house 120, mask house 130, and IC manufacturer 150 may be a single entity or separate entities.

The design house (or design team) 120 generates an IC design layout 122. The IC design layout 122 includes various geometrical patterns designed for an IC product, based on a specification of the IC product to be manufactured. The geometrical patterns correspond to patterns of metal, oxide, or semiconductor layers that make up the various components of the IC device 162 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 uses the IC design layout 122 to manufacture one or more masks to be used for fabricating the various layers of the IC product according to the IC design layout 122. The mask house 130 performs mask data preparation 132, where the IC design layout 122 is translated into a form that can be physically written by a mask writer. Data preparation 132 may include optical proximity correction (OPC) and a lithography process check (LPC) to compensate for image errors and simulate mask fabrication. The mask house 130 also performs mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

During mask fabrication 144, a mask or group of masks are fabricated based on the modified IC design layout. For example, an electron-beam (e-beam) or a mechanism of multiple e-beams is used to form a pattern on a mask (photomask or reticle) based on the modified IC design layout. The mask can be formed in various technologies. In one embodiment, the mask is formed using binary technology. In the present embodiment, a mask pattern includes opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art. In other embodiments, the photomask may be an EUV (extreme ultraviolet) photomask suitable for lithography processes using light radiation having wavelengths in the range of about 13.5 nm or less.

After a mask has been fabricated, the mask house performs a mask inspection 146 to determine if the fabricated mask includes any defects, such as full-height and non-full-height defects. If any defects are detected, the mask may be cleaned or the IC design may be modified further depending on the types of defects detected.

It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150, and a mask rule check (MRC) to modify the IC design layout to compensate for limitations during mask fabrication 144. Additionally, the processes applied to the IC design layout 122 during mask fabrication 144 and mask inspection 146 may be executed in a variety of different orders and may include a variety of different and/or additional steps.

Figure 2:
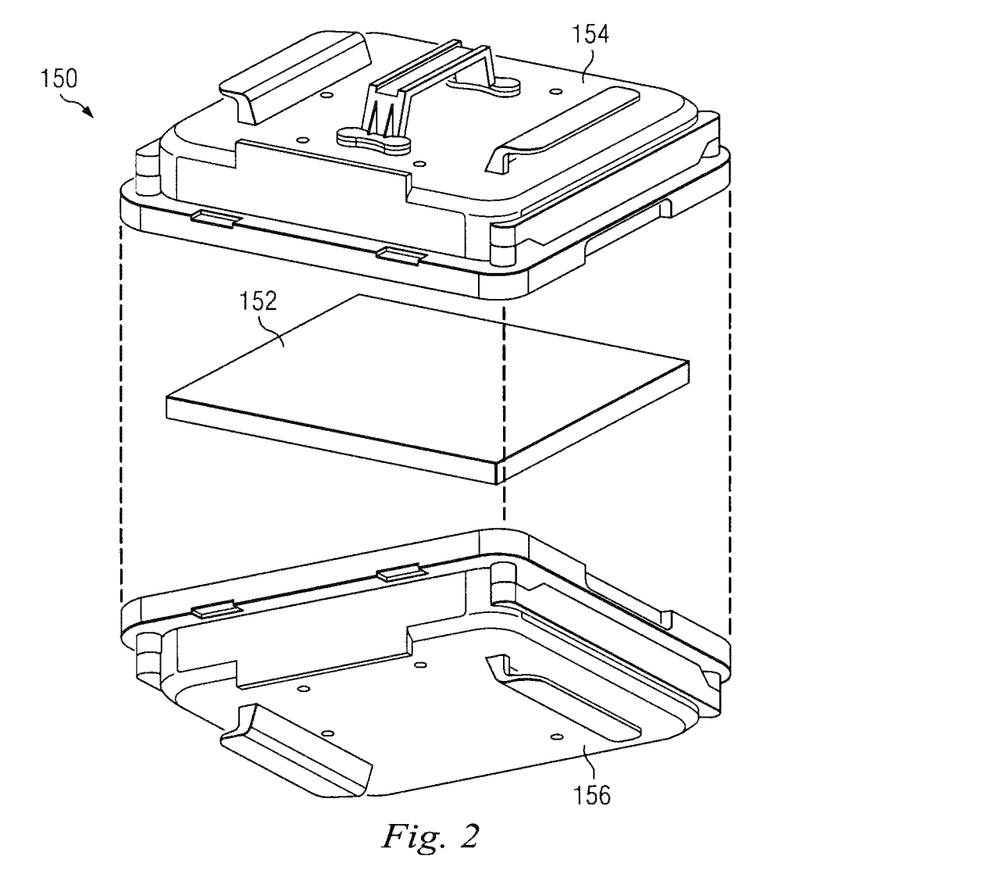
FIG. 2 illustrates an exploded perspective view of an example photomask pod and a photomask stored in the pod.

After a photomask has been fabricated by the mask house 130, it may be transported to various locations, such as the IC manufacturer 158 (i.e., fab). To prevent damage during transportation, photomasks are stored and transported in transportation containers/carriers, such as a photomask pod 148 shown in FIG. 1. In this regard, FIG. 2 illustrates an exploded perspective view of an example photomask pod 150 and a photomask 152 stored in the pod. Specifically, the pod 150 may include a top cover portion 154 and a bottom cover portion 156. In one embodiment, the pod 150 may have a dual pod design and include various other portions and features, for instance, the pod may include an inner pod assembly with a cover and base plate and an outer pod assembly that fits around the inner pod assembly. For the sake of clarity, these are not shown in FIG. 2. In the illustrated embodiment, the pod 150 is designed to hold an EUV photomask that is not protected by a pellicle. Thus, it is desirable for the pod 150 to be entirely or substantially free of foreign particles before the photomask 152 is transported inside of the pod so that the photomask is not contaminated. In other embodiments, the pod may be some other type of storage and/or transportation receptacle that is more suitable for use when it is free or substantially free of foreign particles.

Referring back to FIG. 1, the IC manufacturer 158, such as a semiconductor foundry, uses the mask (or masks) fabricated by the mask house 130 to fabricate the IC device 162. The IC manufacturer 158 is a IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer 160 is fabricated using the mask (or masks) to form the IC device 162. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, in a deposition process (e.g., chemical vapor deposition (CVD) or physical vapor deposition (PVD)) to form a thin film in various regions on the semiconductor wafer, and/or other suitable processes.

Figure 3:
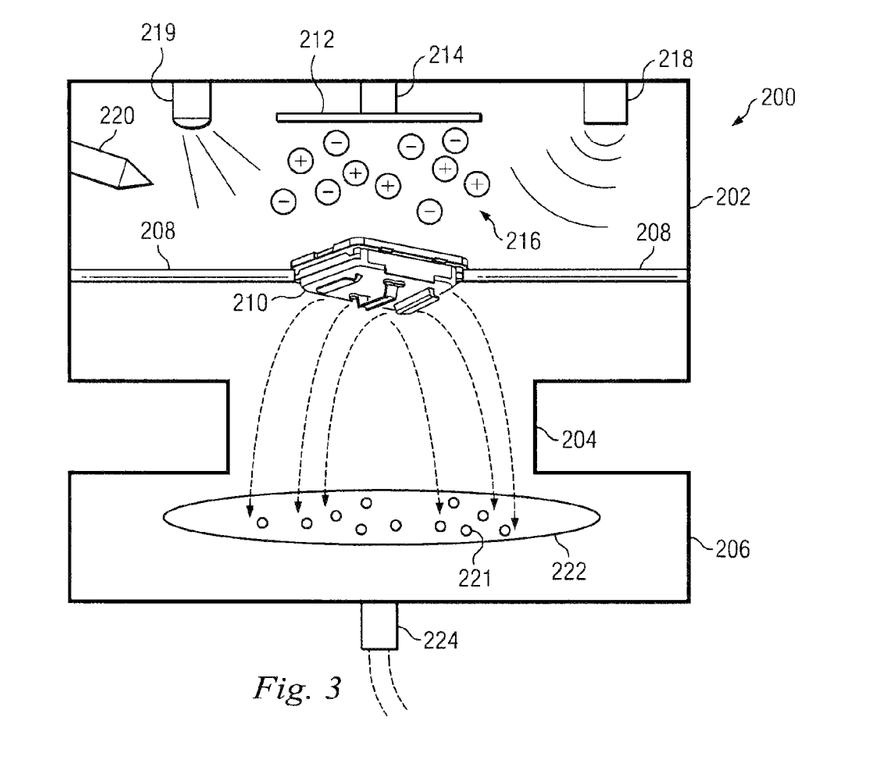
FIG. 3 illustrates a system configured to remove foreign particles from articles such as photomask transportation and storage pods and to determine the cleanliness of the articles after the removal according to aspects of the present disclosure.

FIG. 3 illustrates a system 200 configured to remove foreign particles from articles photomask transportation and storage pods and to determine the cleanliness of the articles after the removal according to aspects of the present disclosure. In one embodiment, the system 200 is operable to remove particles sized in the range of about 10-35 nm. These size particles are especially disruptive of lithography processes utilizing EUV photomasks. It is understood that although the present disclosure including FIGS. 3-7 is directed to removing particles from photomask transportation pods, the methods and systems described below may be utilized to clean and determine the cleanliness of a wide variety of articles that may have foreign particles disposed thereon.

In more detail, the system 200 includes a cleaning chamber 202, a pass-through chamber 204, and a particle collection chamber 204, where the pass-through chamber couples the cleaning chamber to the particle collection chamber such that they are in fluid communication. The cleaning chamber 202 may be sealed and pressurized so the pressure within the chamber may be controlled to suit the specific cleaning process employed. For instance, a vacuum may be formed in the cleaning chamber 202 to assist in the removal of all moisture from the article being cleaned. Further, in one embodiment, a specific atmospheric pressure may be created within the chamber so as to most efficiently propagate ultrasonic sounds toward an article being cleaned. The cleaning chamber 202 includes retaining structures 208 that are configured to hold an article 210 to be cleaned within the cleaning chamber 202. The retaining structures 208 are adjustable so that they may retain a wide variety of differently shaped and sized articles. For example, in the illustrated embodiment of FIG. 3, the article 210 is a cover of a photomask transportation pod, such as the top cover portion 154 of FIG. 2. Because the retaining structures are adjustable, a photomask pod may be disassembled and each piece may be separately cleaned within the chamber 202 even if they are different sizes and shapes. Further, the retaining structures 208 are rotatable relative to the interior of the chamber 202. Accordingly, the article 210 may be rotated during a cleaning process so that all surfaces may be exposed and also so that loose particles disposed on a surface of the article 210 may fall away from the article during the rotation.

The system 200 further includes a gas distributor 212 disposed within the cleaning chamber 202. The gas distributor 202 is configured to inject gas molecules into the cleaning chamber 202 for various particle removal techniques. A gas inlet 214 feeds gas from various sources into the gas distributor 212 where it is dispersed into the cleaning chamber 202. In one embodiment, the gas inlet 214 includes a control mechanism to control the amount and velocity of the gas entering the cleaning chamber 202. As will be discussed in greater detail below, the gas distributor includes a plurality of distribution apertures through which the gas enters the chamber. In one embodiment, the plurality of distribution apertures may vary in size and shape. Depending on the cleaning process employed by the system 200, various different types of gas may be distributed into the cleaning chamber 202. For example, nitrogen, argon, and oxygen are some examples of gases that may be distributed into the cleaning chamber to remove particles from an article such as the article 210. In the illustrated embodiment, the gas distributor is operable to disburse electrically charged gas molecules 216 into the cleaning chamber 210 during a cleaning process. In one embodiment, the distributor 212 includes a charging mechanism to charge the gas molecules as they flow through the distributor. Such charged gas molecules may be utilized to remove particles in various manners. For example, foreign particles may be attracted to and thus attached to the article 210 because the particles have an electrical charge, static or otherwise. Subjecting the charged foreign particles to charged gas may neutralize the particles, weakening their attraction to the article 210. Further, the force of the gas 216 as projected out of the distributor 212 may also forcibly remove any particles attached to the article 210. The manner in which the charged gas 216 may be utilized to remove foreign particles is discussed in greater detail in association with FIGS. 4 and 5.

The system 200 further includes a vibration generator 218 disposed in the cleaning chamber 202. The vibration generator 218 is operable to impart physical movement such as vibrations to the article 210, thus facilitating the removal of foreign particles from the article's surface. In one embodiment, the vibration generator 218 may be utilized in conjunction with the charged gas 216 to remove foreign particles from the cover. For example, the charged gas 216 may neutralize any charged foreign particles thus lessening their attraction to the article 210. If the neutralized particles do not immediately detach from the article 210, the vibration generator 218 is operable to vibrate the article and shake loose the remaining particles. The vibration generator 218 may utilize a variety of mechanisms to impart movement to the article to be cleaned in the chamber 202. In one embodiment, the vibration generator 218 directs ultrasonic waves at the cover 210. Such ultrasonic waves impart vibrations into the cover 210, thus simulating the vibrations caused by transportation. Ideally, any foreign particles that would shake loose onto a photomask during transportation will shake loose during the cleaning process instead. To facilitate the propagation of ultrasonic waves through the cleaning chamber 202, the chamber 210 may be pressurized to a specific pressure to most efficiently effect the cleaning process. In one embodiment, the vibration generator 218 may vary the intensity, power, and wavelength of the ultrasonic waves directed at the article 210. In another embodiment, the vibration generator 218 directs pulsed laser energy at the article 210 to impart shock waves in the article. For instance, the vibration generator 218 may direct a laser pulse of high power (e.g., over $10^9$ W/cm$^2$) and short duration (e.g. a nanosecond) at the article 210 and as the laser energy impacts the surface of the article a shock wave is generated. This shock wave may loosen or entirely detach foreign particles attached to the article 210. Because laser energy is focused on a particular location, the vibration generator 218 may be configured to scan the pulsed laser energy across the surface of the article 210. The power and duration of the laser emanating from the vibration generator may be tuned based on the type of material out of which the article is constructed. In alternative embodiments, the vibration generator 218 may utilize different techniques to generate vibrations or other movement in the article 210 such that foreign particles attached thereto are loosened or detached.

In the illustrated embodiment, the system 200 further includes an ultraviolet (UV) light source 219 disposed in the cleaning chamber 202. The UV light source 219 is configured to be used in conjunction with oxygen ($O_2$) gas injected into the cleaning chamber 219 by the gas distributor 212 to create ozone gas ($O_3$). Specifically, ozone gas formed in the cleaning chamber 202 by oxygen absorbing UV light is utilized to decompose any organic foreign particles attached to the article 210. The ozone gas may not remove organic particles from the article 210 but it may shrink them, making them easier to remove by other methods such as vibrations. Further, the system 200 includes a carbon dioxide ($CO_2$) snow jet 220 to aid in the removal of foreign particles attached to the article 210. Specifically, the snow jet 220 ejects a stream of crystallized carbon dioxide particles that impacts the surface of the article 210 and dislodges any foreign particles attached thereto through momentum transfer.

It is understood that the particle removal systems described above including the gas distributor 212, the vibration generator 218, the UV light source 219, and the carbon dioxide ($CO_2$) snow jet 220 and the methods of cleaning associated with each are simply examples of cleaning mechanisms that may be employed within the cleaning chamber 202. Various embodiments of the system 200 may include different subsets of the cleaning mechanisms and they may be used alone or in combination to effectuate particle removal from the article 210. Further, additional and/or different cleaning systems and methods may be employed to clean articles within the cleaning chamber 202 without departing from the scope of the present disclosure. For instance, the retaining structures 208 may be operable to physically vibrate an article held between them to dislodge particles attached to the article.

While subjecting the article 210 to the various cleaning mechanism described above, foreign particles 221 will ideally detach from the article. The system 200 is configured such that the detached particles 221 fall from the article 210 and flow through the pass-through chamber 204 and into the particle collection chamber 206. The particle collection chamber 206 includes a particle collection surface 222 that is disposed beneath the pass-through chamber 204. In the illustrated embodiment, the pass-through chamber 204 is configured to direct the detached particles 221 onto the particle collection surface 222. In that regard, the particle collection surface 222 has a width greater or equal to the pass-through chamber 204 so that all particles moving through the pass-through chamber 204 are deposited on the surface 222. Further, the particle collection chamber 206 includes a gas outlet valve 224 that expels gas out of the system 200. The gas outlet value 224 is disposed within the particle collection chamber such that gas output by the gas distributor 212 flows past the article 210, through the pass-through chamber 204, and in the direction of the particle collection surface 222. Thus, as gas flows through the system 200, it carries any detached foreign particles 221 away from the article 210 and deposits them on the particle collection surface 222. In one embodiment, the gas outlet value is coupled to a pumping system (not illustrated) that creates a pressure differential in the particle collection chamber 206 such that detached particles 221 flow more efficiently toward the particle collection surface 222.

In one embodiment, the particle collection surface 222 is a silicon wafer, but in alternative embodiments, the surface 222 may be any other surface operable to collect foreign particles deposited thereon. In some embodiments, the particle collection surface 222 includes a coating configured to secure particles to the surface once they are deposited. In another embodiment, an electric charge is applied to the particle collection surface 222 to attract foreign particles that detached from the article 210.

After a cleaning process has been completed and foreign particles have detached from the article 210 and been deposited onto the particle collection surface 222, the collection surface is removed from the particle collection chamber 206 and inspected. If no foreign particles are detected on the collection surface, it is likely that the article 210 is free or substantially free of foreign particles. If particles are detected on the collection surface, additional particles may remain attached to the article, and thus another round of cleaning may be desired. In one embodiment, the collection surface 222 may be inspected with semiconductor wafer and photomask inspections tools such as optical inspection tools and electron-beam (e-beam) inspection tools to determine if the collection surface has any foreign particles deposited thereon. Because an e-beam inspection tool (i.e., scanning electron microscope) is capable of higher resolution imaging than an optical inspection tool, it may be better suited for inspecting for particles on the collection surface that are below about 20 nm in size. In other embodiments, the collection surface 222 may be inspected with different and/or additional inspection tools such as a scanning probe microscope system, a laser microscope system, a transmission electron microscope system, a focus ion beam microscope system, or other suitable imaging tools. In one embodiment, the particle collection surface 222 is inspected before it is inserted into the system 200 so that any particles attached to the collection surface prior to the cleaning process are not counted during the after-cleaning inspection. A method of removing foreign particles from an article and determining the cleanliness of the article will be discussed in association with FIG. 7.

It is understood that the illustrated embodiment of system 200 in FIG. 3 is simply an example and the system may be altered without departing from the scope of the present disclosure. For example, one embodiment of system 200 may exclude the pass-through chamber 204 and another may include only the cleaning chamber 202, where the particle collection surface 222 is disposed within the cleaning chamber 202.

Figure 4:
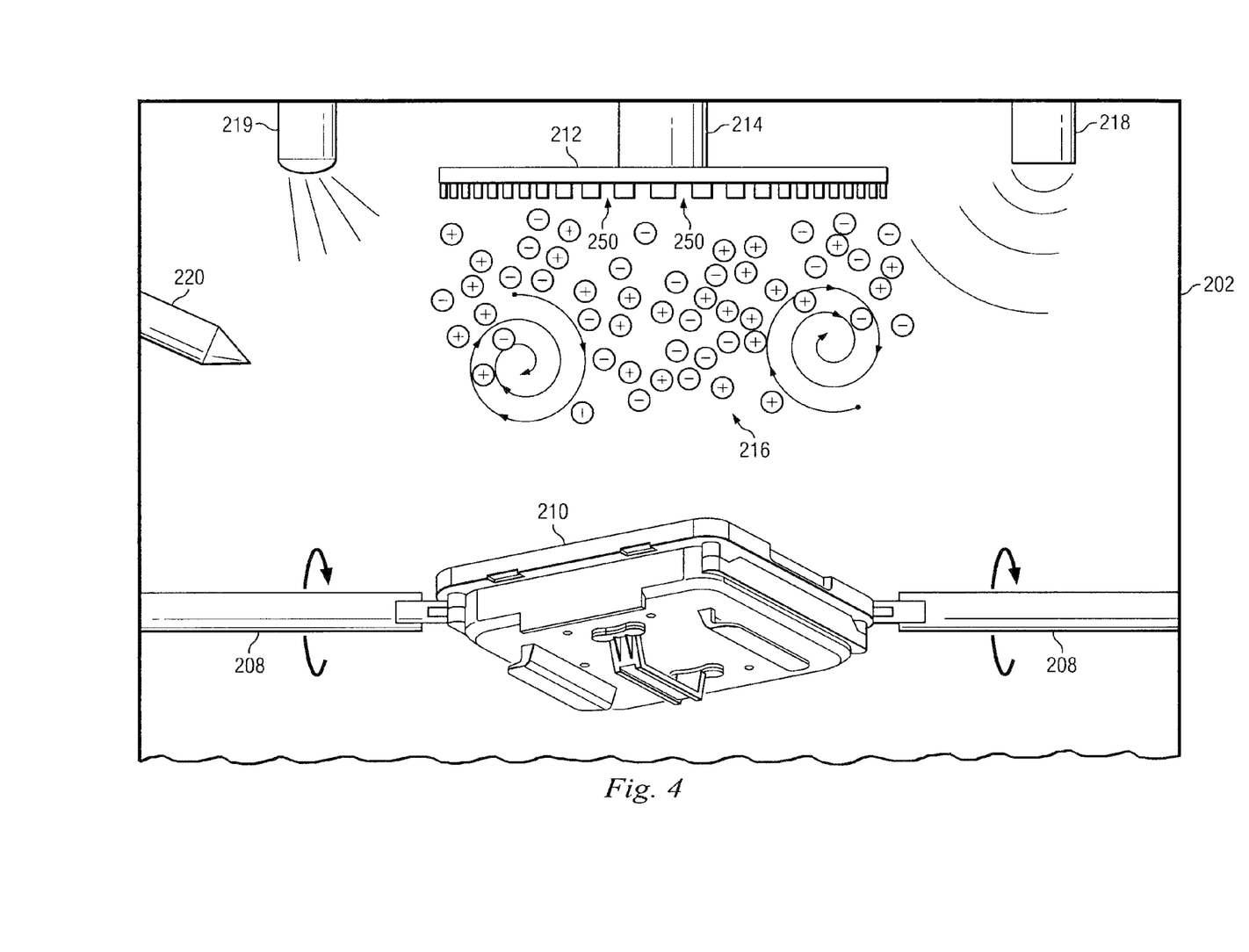
FIG. 4 is a more detailed view of a portion of the system 200 of FIG. 3.
Figure 5:
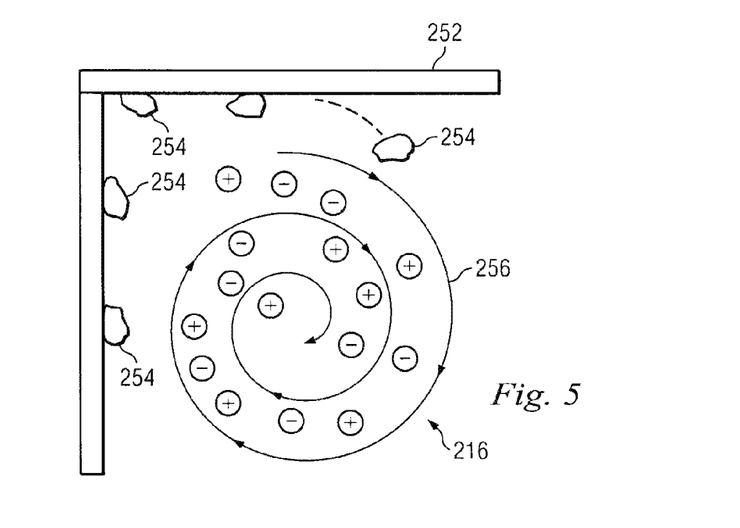
FIG. 5 illustrates a corner of the article of FIGS. 3 and 4 that includes a plurality of foreign particles attached thereto.

FIG. 4 illustrates a portion of the system 200 of FIG. 3. Specifically, FIG. 4 is a more detailed view of the cleaning chamber 202 in which the article 210 is retained by the retaining structures 208. As mentioned above and shown in FIG. 4, the retaining structures 208 are rotatable such that an article held between them may be turned for more effective cleaning. Further, FIG. 4 includes a more detailed view of the gas distributor 212. The gas distributor 212 is configured to eject a turbulent flow—rather than a laminar flow—of gas molecules into the cleaning chamber 202. In this regard, the gas distributor includes a plurality of distribution apertures 250 through which the gas injected into the cleaning chamber 202 passes. The size and placement of the apertures 250 on the gas distributor 212 affects the flow of gas out of the distributor, and, as shown in the illustrated embodiment, causes the flow of gas into the chamber 202 to be turbulent. In the example embodiment of FIG. 4, the apertures 250 in the center portion of the gas distributor 212 are larger than the apertures in the edges portions of the distributor. The uneven distribution of the gas molecules 216 creates turbulence, which increases the effectiveness of the gas in removing particles from the article 210. In more detail, while a laminar flow of gas molecules may contact all flat surfaces of the article 210 in the cleaning chamber 202, it may not reach all corners and opening of the article. However, the turbulent flow of gas molecules 216 may contact all or a substantial portion of the surface area of the article 216, including any corners and openings. In this regard, FIG. 5 illustrates a corner 252 of the article 210 that includes a plurality of foreign particles 254 attached thereto. In the illustrated example, the turbulent flow of gas molecules 216 has flowed into the corner 252 and has formed an eddy 256 within the corner. The eddy 256 makes it more likely that the gas molecules 216 will contact the foreign particles 254 in the corner 252 and either physically dislodge them or neutralize their charge so they detach more easily during other cleaning procedures. It is understood that in alternative embodiments, the plurality of apertures in the gas distributor 212 may be sized differently and positioned in an alternate manner than as shown in the illustrated embodiment of FIG. 4. Further, the gas distributor 212 may create a turbulent flow of gas molecules in the cleaning chamber 202 in an alternate manner in alternative embodiments.

Figure 6:
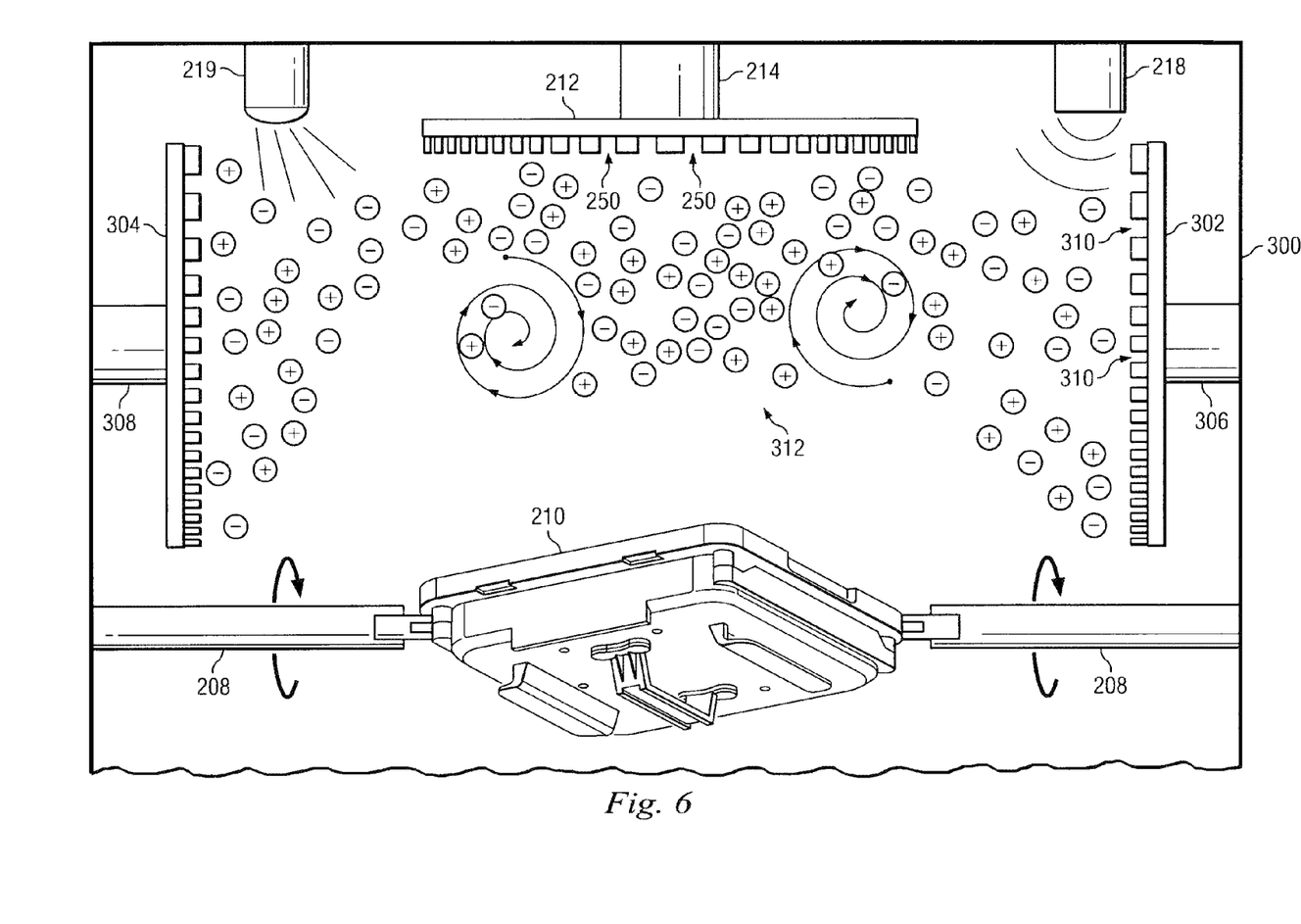
FIG. 6 illustrates a further embodiment of a cleaning chamber that similar to the cleaning chamber in FIGS. 3 and 4.

Referring now to FIG. 6, illustrated is a further embodiment of a cleaning chamber 300 that similar to the cleaning chamber 202 in FIGS. 3 and 4. For the sake of convenience, features in FIG. 6 similar to features in FIGS. 3-4 have been labeled with similar reference numerals but this labeling scheme is not intended to limit the illustrated embodiments of FIGS. 3-6. The cleaning chamber 300 may be a portion of a system similar to system 200 of FIG. 3 or it may be a portion of a system configured differently than system 200.

In the illustrated embodiment of FIG. 6, the article 210 is secured inside of the cleaning chamber 300 by the rotatable retaining structures 208. As discussed above, the article 210 may be any article that has unwanted foreign particles attaches thereto. In the illustrated embodiment, the article 210 is a cover of a photomask transportation pod, but, in other embodiments, the article may be other items that are required to be substantially free of foreign particles. The cleaning chamber 300 differs from the cleaning chamber 202 of FIGS. 3 and 4 in that it includes a plurality of gas distributors. The gas distributor 212 is disposed at a top portion of the chamber 300 and two additional gas distributors 302 and 304 are disposed at opposing side portions of the chamber. The gas distributor 302 is fed by a gas inlet valve 306 and the gas distributor 304 is fed by a gas inlet valve 308. Like the gas distributor 212, the gas distributor 302 includes a plurality of distribution apertures 310. The apertures 310 vary in size and thus each injects a different amount of gas into the chamber 300. In the illustrated embodiment of FIG. 6, the apertures 310 decrease in size along the length of the gas distributor 302, with the smallest apertures being most near the article 210. This variation of aperture size creates a turbulent flow of gas molecules 312. Further, the flow of gas out of the distributor 302 intermixes with the flow of gas out of the distributors 212 and 304 creating additional turbulence in the chamber 300. As mentioned above, this turbulence allows the gas molecules 312 to interact with foreign particle attached disposed in corners and openings in the article 210. It is understood that the plurality of apertures may be sized and arranged in alternate manners in alternative embodiments to create different types of gas flows within the chamber 300. For example, in one embodiment, the plurality of apertures in the gas distributor 304 may be arranged differently than the plurality of apertures 310 in the gas distributor 302.

Figure 7:
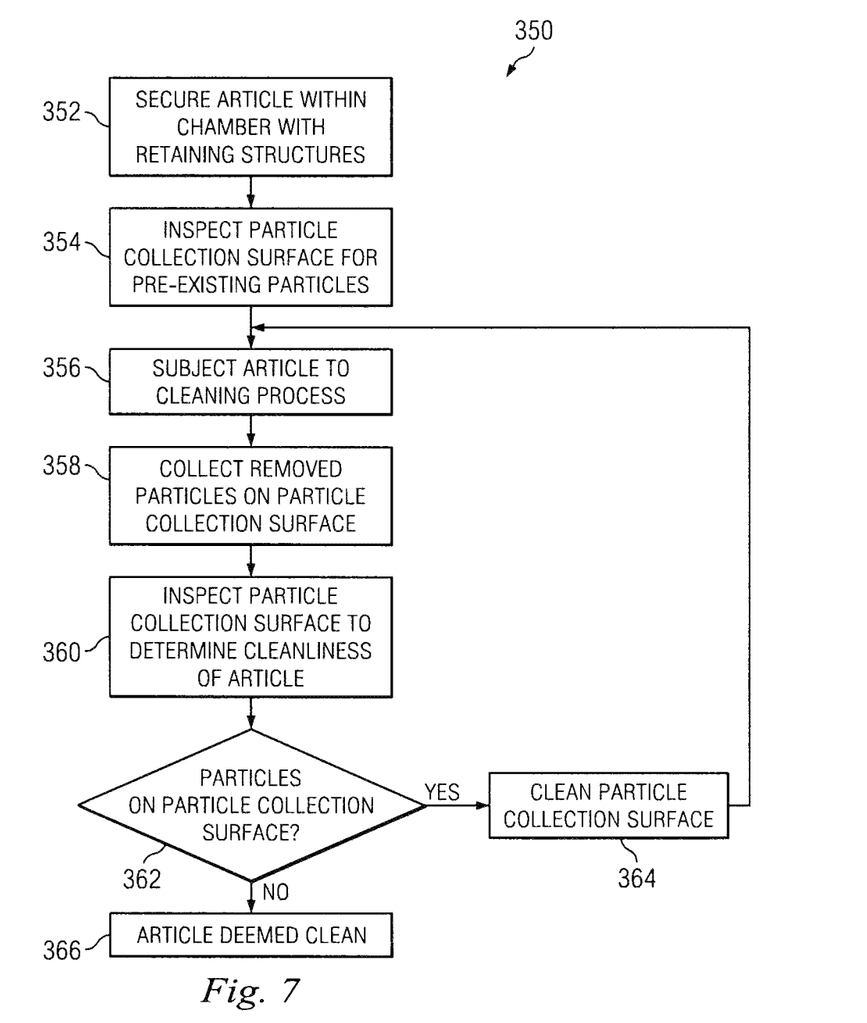
FIG. 7 illustrates a high-level flowchart of a method of removing particles from an article and determining the cleanliness of the article according to various aspects of the present disclosure.

Referring now to FIG. 7, illustrated is a high-level flowchart of a method 350 of removing particles from an article and determining the cleanliness of the article according to various aspects of the present disclosure. In one embodiment, the method 350 may be carried out, for example, with system 200 of FIG. 2.

The method 350 begins at block 352 where the article 210 is secured within the cleaning chamber 202 using the retaining structures 208. The retaining structures may be adjusted based on the size and shape of the article being cleaned. The method 350 next proceeds to block 354 where the particle collection surface 222 is inspected for pre-existing particles. In one embodiment, if pre-existing particles are detected, the collection surface is cleaned, but, in other embodiments, the pre-existing particles are simply noted and subtracted from any particles detected after the cleaning process. After the particle collection surface 222 is inspected, it is inserted into the particle collection chamber 206 prior to a cleaning process. Next, the method 350 proceeds to block 356 where the article 210 is subjected to a cleaning process in the cleaning chamber 202 that removes any foreign particles attached to the article's surface. As discussed above, may different cleaning processes may be employed for particle removal. For example, a turbulent flow of charged gas molecules 216 may be distributed into the cleaning chamber 202 to dislodge and/or neutralize particles attached to the article 210. Further, the vibration generator 218 may be utilized to impart vibrations in the article 210 and shake loose previously neutralized particles. Further, additional and/or different cleaning processes may be employed to remove foreign particles from the article 210 such as the use of ozone to decompose organic particles and/or a jet of carbon dioxide snow.

Next, in block 358, foreign particles detached from the article 210 are deposited on the particle collection surface 222 as the cleaning process is being performed. The detached particles may be carried to the particle collection surface by the flow of gas from the cleaning chamber 202 to the particle collection chamber 206. After the cleaning process is complete, the method 350 proceeds to block 360 where the particle collection surface 222 is inspected to determine the cleanliness of the article 210. Specifically, the particle collection surface 222 is inspected to determine if any particles were detached from the article 210 and deposited on the particle collection surface. In decision block 362, it is determined whether there are foreign particles on the particle collection surface. If foreign particles are detected on the particle collection surface, the method 350 returns to block 356 where the article is cleaned again. If at the decision block 362 it is determine that no particles were deposited on the particle collection surface during the cleaning, the method 350 proceeds to block 366 and the article is deemed free or substantially free of foreign particles and may be utilized for cleanliness-sensitive tasks. For example, if the article is a portion of a photomask transportation pod, it may now be combined with other clean portions of the photomask pod and the pod may be used to store or transport photomasks. The cleaning and inspecting cycle of method 350 may be repeated until no particles are detected on the particle collection surface and the article may be deemed clean.

It is understood that method 350 of cleaning and determining the cleanliness of an article is simply an example embodiment, and in alternative embodiments, additional and/or different steps may be included in the method. For example, in one embodiment, in the decision block 362, the number of particles detected on the particle collection surface may be compared against a cleanliness threshold and if the number of particles detected is below the threshold, the article will be deemed clean.

Further, portions of the method 350 cleaning and determining the cleanliness of an article of the illustrated embodiment may be designed to be executed on any computing architecture. For example, portions of the method 350 may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example. Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a cleaning and inspection system. The cleaning and inspection system includes a cleaning chamber and retaining structure disposed within the cleaning chamber and configured to secure an article to be cleaned within the cleaning chamber. The cleaning and inspection system also includes a gas distributor disposed within the cleaning chamber and configured to distribute a turbulent flow of gas into the cleaning chamber that facilitates removal of foreign particles from a surface of the article. Further, the system includes a particle collection surface positioned to collect foreign particles removed from the surface of the article.

In another exemplary aspect, the present disclosure is directed to a method of cleaning and inspecting an article. The method includes securing the article within a cleaning chamber using retaining structure and distributing a turbulent flow of gas into the cleaning chamber to facilitate the removal of any foreign particles attached to a surface of the article. The method also includes collecting any foreign particles removed from the surface of the article on a particle collection surface and inspecting the particle collection surface to determine the presence of any foreign particles removed from the surface of the article.

In yet another exemplary aspect, the present disclosure is directed to a cleaning and inspection system. The cleaning and inspection system includes a cleaning chamber, a pass-through chamber coupled to the cleaning chamber, and a particle collection chamber coupled to the pass-through chamber and in fluid communication with the cleaning chamber via the pass-through chamber. The system also includes retaining structure disposed within the cleaning chamber and configured to secure an article to be cleaned within the cleaning chamber and a gas distributor disposed within the cleaning chamber and configured to distribute a turbulent flow of electrically charged gas into the cleaning chamber that neutralizes any electrically charged foreign particles attached to a surface of the article. Further, the system includes a vibration generator disposed within the cleaning chamber and configured to impart movement to the article such that any foreign particles neutralized by the electrically charged gas are detached from the surface of the article and a particle collection surface disposed within the particle collection chamber and positioned with respect to the pass-through chamber so as to collect foreign particles removed from the surface of the article.

What is claimed is:

1. A method of cleaning and inspecting an article, comprising:
    securing the article within a cleaning chamber using a retaining structure;
    distributing a turbulent flow of gas into the cleaning chamber to facilitate removal of any foreign particles attached to a surface of the article;
    collecting any foreign particles removed from the surface of the article on a particle collection surface, the particle collection surface being a surface of a semiconductor substrate; and
    inspecting the particle collection surface to determine a presence of any foreign particles removed from the surface of the article.

2. The method of claim 1, wherein the collecting includes directing any foreign particles removed from the surface of the article toward the particle collection surface.

3. The method of claim 1, further including inspecting, prior to the collecting, the particle collection surface to determine a presence of any pre-existing particles.

4. The method of claim 1,
    wherein the particle collection surface is a surface of a silicon wafer; and
    wherein the inspecting includes inspecting the surface of the silicon wafer with a semiconductor wafer inspection tool.

5. The method of claim 1, wherein the distributing includes distributing a gas into the cleaning chamber through a plurality of differently-sized distribution apertures, the plurality of differently-sized distribution apertures creating the turbulent flow of gas.

6. The method of claim 1, wherein the distributing includes distributing charged gas molecules into the cleaning chamber to electrically neutralize any charged foreign particles attached to the surface of the article.

7. The method of claim 1, further including imparting physical movement in the article with a vibration generator disposed in the cleaning chamber to facilitate the removal of any foreign particles attached to the surface of the article.

8. A method of cleaning and inspecting an article, comprising:
    securing the article within a cleaning chamber using a retaining structure, wherein the article is an apparatus configured to transport or store one or more photomasks;
    distributing a turbulent flow of electrically charged gas into the cleaning chamber to facilitate removal of any foreign particles attached to a surface of the article, the turbulent flow of electrically charged gas neutralizing any electrically charged foreign particles attached to a surface of the article;
    directing the turbulent flow of electrically charged gas into a particle collection chamber with a pass-through chamber interposed between the cleaning chamber and the particle collection chamber;

collecting any foreign particles removed from the surface of the article on a particle collection surface in the particle collection chamber, the particle collection surface having width at least as great as a width of the pass-through chamber; and inspecting the particle collection surface to determine a presence of any foreign particles removed from the surface of the article.

9. The method of claim 8, wherein the particle collection surface is a silicon wafer; and wherein the inspecting includes inspecting the silicon wafer with a semiconductor wafer inspection tool.

10. The method of claim 8, wherein the distributing includes distributing a gas into the cleaning chamber through a plurality of differently-sized distribution apertures, the plurality of differently-sized distribution apertures creating the turbulent flow of gas.

11. The method of claim 8, further including imparting physical movement in the article with a vibration generator disposed in the cleaning chamber to facilitate the removal of any foreign particles attached to the surface of the article.

12. The method of claim 11, wherein the imparting physical movement in the article includes directing ultrasonic waves at the article to impart vibrations in the article.

13. The method of claim 11, wherein the imparting physical movement in the article includes directing pulsed laser energy at the article to impart shock waves in the article.

14. The method of claim 8, wherein the distributing the turbulent flow of electrically charged gas includes distributing the turbulent flow of electrically charged gas with a plurality of gas distributors disposed in the cleaning chamber.

15. The method of claim 8, further including converting oxygen in the cleaning chamber into ozone gas to facilitate decomposition of organic particles attached to the surface of the article.

16. A method of cleaning and inspecting an article, comprising:

securing the article within a cleaning chamber using a retaining structure, wherein the retaining structure is rotatable about its longitudinal axis;

distributing a turbulent flow of gas into the cleaning chamber to facilitate removal of any foreign particles attached to a surface of the article;

imparting physical movement in the article with a vibration generator disposed in the cleaning chamber to facilitate the removal of any foreign particles attached to the surface of the article;

directing the turbulent flow of gas into a particle collection chamber by creating a pressure differential between the cleaning chamber and the particle collection chamber;

concurrently rotating the article by rotating the retaining structure about its longitudinal axis during cleaning;

collecting any foreign particles removed from the article on a particle collection surface; and inspecting the particle collection surface to determine a presence of any foreign particles removed from the article.

17. The method of claim 16, wherein the collecting includes securing the foreign particles to the particle collection surface with a coating on the particle collection surface.

18. The method of claim 16, wherein the distributing includes distributing a gas into the cleaning chamber through a plurality of differently-sized distribution apertures, the plurality of differently-sized distribution apertures creating the turbulent flow of gas.

19. The method of claim 16, wherein the distributing the turbulent flow of gas includes distributing the turbulent flow of gas with a plurality of gas distributors disposed in the cleaning chamber.

20. The method of claim 16, further including converting oxygen in the cleaning chamber into ozone gas to facilitate decomposition of organic particles attached to the surface of the article.

* * * * *